US012451386B2

(12) United States Patent
Aguilar Santillan et al.

(10) Patent No.: US 12,451,386 B2
(45) Date of Patent: *Oct. 21, 2025

(54) ELECTROSTATIC CHUCK

(71) Applicant: ASM IP Holding B.V., Almere (NL)

(72) Inventors: Joaquin Aguilar Santillan, Gilbert, AZ (US); Hong Gao, San Jose, CA (US); Shanker Kuttath, Austin, TX (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/662,796

(22) Filed: May 13, 2024

(65) Prior Publication Data

US 2024/0297063 A1 Sep. 5, 2024

Related U.S. Application Data

(63) Continuation of application No. 17/570,232, filed on Jan. 6, 2022, now Pat. No. 11,996,312.

(60) Provisional application No. 63/136,086, filed on Jan. 11, 2021.

(51) Int. Cl.
| | |
|---|---|
| *H01T 23/00* | (2006.01) |
| *H01L 21/67* | (2006.01) |
| *H01L 21/683* | (2006.01) |
| *H05B 3/12* | (2006.01) |
| *H05B 3/18* | (2006.01) |

(52) U.S. Cl.
CPC .... *H01L 21/6833* (2013.01); *H01L 21/67103* (2013.01); *H05B 3/12* (2013.01); *H05B 3/18* (2013.01); *H05B 2203/017* (2013.01)

(58) Field of Classification Search
None
See application file for complete search history.

(56) References Cited

U.S. PATENT DOCUMENTS

| | | | |
|---|---|---|---|
| 11,996,312 B2* | 5/2024 | Aguilar Santillan | ........................ C23C 16/4586 |
| 2019/0279893 A1 | 9/2019 | Parkhe et al. | |
| 2022/0223453 A1* | 7/2022 | Aguilar Santillan | ........................ C04B 35/583 |

* cited by examiner

*Primary Examiner* — Stephen W Jackson
(74) *Attorney, Agent, or Firm* — Snell & Wilmer L.L.P.

(57) ABSTRACT

Electrostatic chucks and methods of forming electrostatic chucks are disclosed. Exemplary electrostatic chucks include a ceramic body, a device embedded within the ceramic body, and an interface layer formed overlying the device. Exemplary methods include providing ceramic precursor material within a mold, providing a device, coating the device with an interface material to form a coated device, placing the coated device on or within the ceramic precursor material, and sintering the ceramic precursor material to form the electrostatic chuck and an interface layer between the device and ceramic material formed during the step of sintering.

20 Claims, 3 Drawing Sheets

ELECTROSTATIC CHUCK

CROSS-REFERENCE TO RELATED APPLICATIONS

This application is a continuation of U.S. Non-Provisional patent application Ser. No. 17/570,232, filed Jan. 6, 2022, which claims the benefit of and priority to U.S. Provisional Patent Application Ser. No. 63/136,086, filed Jan. 11, 2021, the disclosures of which are hereby incorporated by reference in their entirety.

FIELD OF INVENTION

The present disclosure generally relates to substrate supports. More particularly, the disclosure relates to electrostatic chucks suitable for supporting substrates and to methods of forming the chucks.

BACKGROUND OF THE DISCLOSURE

Electrostatic chucks can be used for a variety of applications during the formation of devices. For example, an electrostatic chuck can be used to retain a substrate, such as a wafer, during lithography, such as extreme ultraviolet lithography (EUVL); plasma-based and/or vacuum-based processing, such as dry etching, plasma enhanced chemical vapor deposition (PECVD), thermal chemical vapor deposition, physical vapor deposition (PVD), ion implantation, and the like. Temperatures during such processes can be relatively high (e.g., about 800° C.) and/or temperature cycling during such processes can be relatively high (e.g., about 800° C.).

A typical electrostatic chuck can include a ceramic body, one or more electrodes (e.g., an electrostatic and an RF electrode) embedded in the body, and a heating element or a plurality of heating elements embedded within the body. The ceramic body, heating element(s), and electrodes can be formed of different materials, which have different coefficients of thermal expansion.

During substrate processing, the high temperatures and/or the temperature variation of the chuck, in combination with the differences in the coefficients of thermal expansion, can cause mechanical fatigue in materials, such as the body, electrodes, or the wire. The mechanical fatigue, in turn, can result in cracks within the body, heating element(s), and/or electrode(s), shortening a lifespan of the electrostatic chuck. Accordingly, improved chucks and methods of forming the chucks are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to electrostatic chucks and to methods of forming electrostatic chucks. While the ways in which various embodiments of the present disclosure address drawbacks of prior chucks and methods are discussed in more detail below, in general, exemplary chucks include an interface layer to mitigate damage, such as cracks, to the chuck that might otherwise occur during temperature cycling of the chucks. Methods of forming improved chucks are also described. Additionally or alternatively, the interface layer can reduce volumetric expansion with temperature (e.g., in the range of about 1 to about 800° C.) of the ceramic body, compared to volumetric expansion of an electrostatic chuck that does not include the interface layer.

In accordance with examples of the disclosure, an electrostatic chuck is provided. The electrostatic chuck includes a ceramic body, a heating element and/or one or more electrodes (e.g., a first and a second electrode, such as an electrostatic electrode and an RF electrode) embedded within the ceramic body, optionally a dielectric layer, and an interface layer formed overlying the heating element and/or the one or more electrodes, and/or between the ceramic body and the dielectric layer, wherein the interface layer can form a solid solution with the ceramic body. The electrostatic chuck can also suitably include fluid channels to allow a fluid to be circulated through portions of the ceramic body and/or fluid reservoirs or channels. The dielectric layer can be between the heating element and one or more electrodes. The ceramic body can include one or more of aluminum nitride, boron nitride, silicon carbide, and silicon nitrate. In some cases, the ceramic body can include up to about 1-100 ppm or about to 1-30 weight percent of an additive, such as an additive selected from the group consisting of one or more of $Al_2MgO_4$, $Al_2O_3$, $Y_2O_3$, MgO, $CaF_2$, and LiF. The heating element can be or include molybdenum or alloys thereof comprising from about 1 at % to about 50 at % or tungsten and/or silicon. The one or more electrodes can be formed of, for example, molybdenum, which, in some cases, may be coated with, for example, gold and/or platinum. The interface layer (e.g., formed over a heating element and/or over an electrode and/or between a dielectric layer and the ceramic body) can include, for example, a (e.g., ceramic) compound that comprises a metal selected from the group consisting of Mg, Ca, Mn, Al, Ba, Be, Zr, Co, Zn, and Cr and one or more of oxygen, nitrogen, carbon, and phosphorous. The interface layer can additionally include an additive selected from the group consisting of one or more of CaO, MnO, MgO, AlON, BaO, BeO, $ZrO_2$, CoO, ZnO, $Cr_2O_3$, and $Al_2O_3$.

In accordance with additional embodiments of the disclosure, a method of forming an electrostatic chuck is provided. An exemplary method includes providing ceramic precursor material within a mold, providing a heating element and/or one or more electrodes, coating the heating element and/or one or more electrodes with an interface material to form a coated heating element and/or coated electrode(s), placing the coated heating element and or electrode(s) on or within the ceramic precursor material, and sintering the ceramic precursor material to form the electrostatic chuck. In addition or as an alternative to coating a heating element and/or electrodes(s), a dielectric layer can be provided and coated with the interface material. In accordance with examples of these embodiments, the interface material forms an interface layer between one or more of the heating element, electrodes(s), and dielectric layer and ceramic material formed during the step of sintering. The step of providing a ceramic precursor material can include providing one or more of aluminum nitride, boron nitride, silicon carbide, and silicon nitrate powder. Exemplary methods can further include a step of providing one or more additives to the mold prior to the step of sintering. The one or more additives can be selected from the group consisting of $Al_2MgO_4$, $Al_2O_3$, $Y_2O_3$, MgO, $CaF_2$, LiF, and the like. The step of sintering can include a typical sintering with applied uniaxial pressure or spark plasma sintering. The step of coating can include, for example, one or more of physical vapor deposition; electrochemical deposition; applying the interface material or interface metal on a surface of the heating element and/or electrode(s) during an extrusion process; deposition of a metal and subsequent oxidation, nitridation, and/or phosphating in a furnace; a gas-phase deposition process, such as chemical vapor deposition and/or atomic layer deposition. By way of particular example, the heating element and/or electrode can include molybdenum and tungsten and the interface material can include a metal selected from the group consisting of Mg, Ca, Mn, Al, Ba, Be, Zr, Co, Zn, Cr and one or more of oxygen, nitrogen, fluoride and phosphate.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
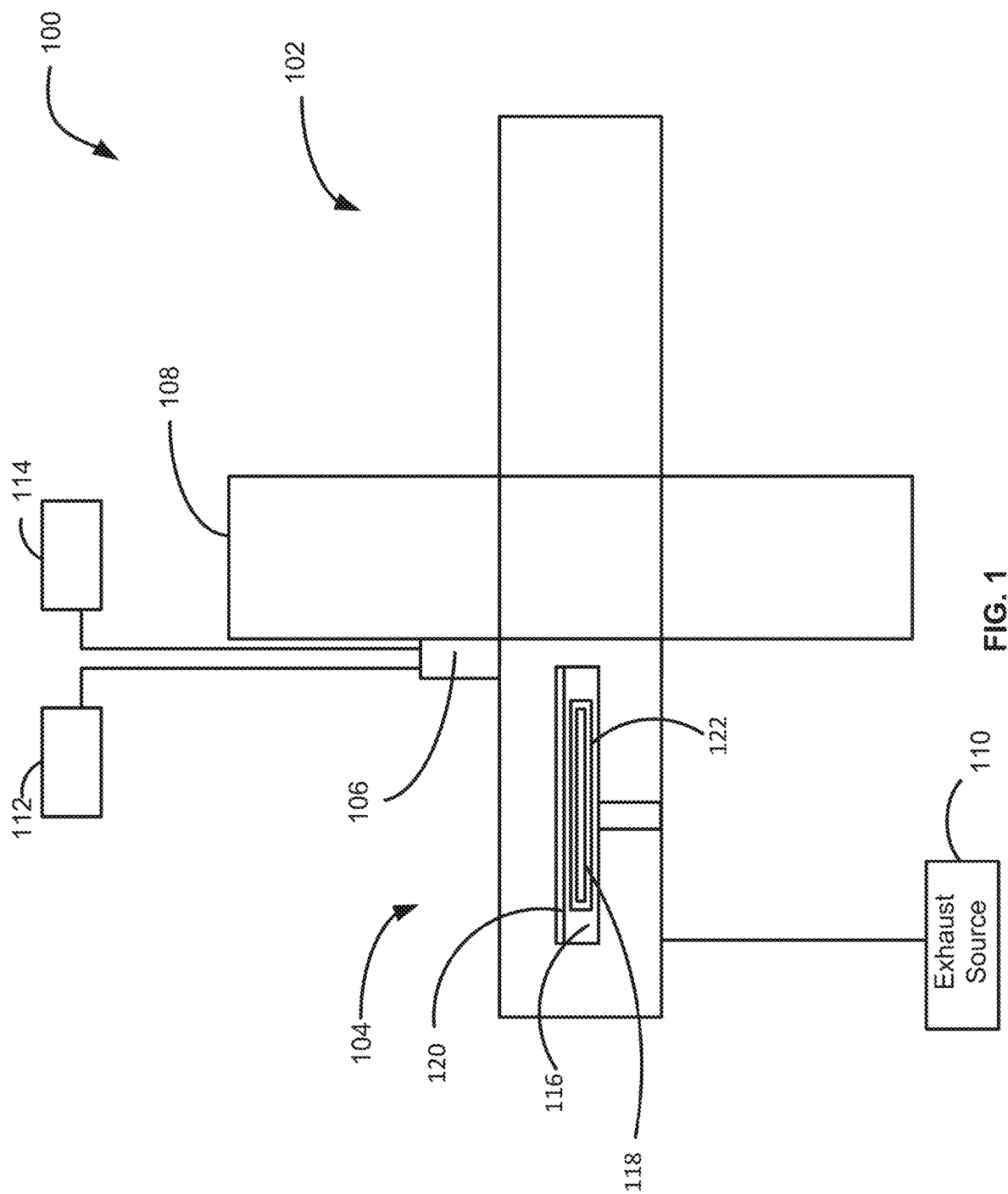
FIG. 1 illustrates a system including an electrostatic chuck in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to electrostatic chucks and to methods of forming electrostatic chucks. The chucks and methods as described herein can be used to process substrates to form, for example, electronic devices. By way of examples, the chucks can be used in wafer processes, such as lithography, e.g., as extreme ultraviolet lithography (EUVL); plasma-based and/or vacuum-based processing, such as dry etching, plasma-enhanced etching, plasma enhanced chemical vapor deposition (PECVD), thermal chemical vapor deposition, physical vapor deposition (PVD), ion implantation, and the like, used to form electronic devices.

In this disclosure, "gas" may include material that is a gas at normal temperature and pressure, a vaporized solid and/or a vaporized liquid, and may be constituted by a single gas or a mixture of gases, depending on the context.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various topologies, such as recesses, lines, and the like formed within or on at least a portion of a layer of the substrate.

In some embodiments, "film" or "coating" refers to a layer (e.g., continuously) extending in a direction perpendicular to a thickness direction. A coating or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates an exemplary reactor system 100. Reactor system 100 can be used for a variety of applications, such as, for example, chemical vapor deposition (CVD), plasma-enhanced CVD (PECVD), atomic layer deposition (ALD), clean processes, etch processes, and the like. Other systems may be used for lithography or ion implantation. Although exemplary embodiments are described below in connection with gas-phase reactor systems, embodiments and the disclosure are not so limited, unless stated otherwise.

In the illustrated example, reactor system 100 includes an optional substrate handling system 102, a reaction chamber 104, a gas injection system 106, and optionally a wall 108 disposed between reaction chamber 104 and substrate handling system 102. System 100 also includes an electrostatic chuck 116 to support one or more substrates or wafers 120. Electrostatic chuck 116 can include one or more embedded devices 118, such as one or more heating elements and/or one or more electrodes and an interface layer 122 formed over one or more devices 118. System 100 can also suitably include a first gas source 112, a second gas source 114, and an exhaust source 110. Although illustrated with two gas sources 112, 114, reactor system 100 can include any suitable number of gas sources. Further, reactor system 100 can include any suitable number of reaction chambers 104, which can each be coupled to a gas injection system 106. In the case in which reactor system 100 includes multiple reaction chambers, each gas injection system can be coupled to the same gas sources 112, 114 or to different gas sources.

Figure 2:
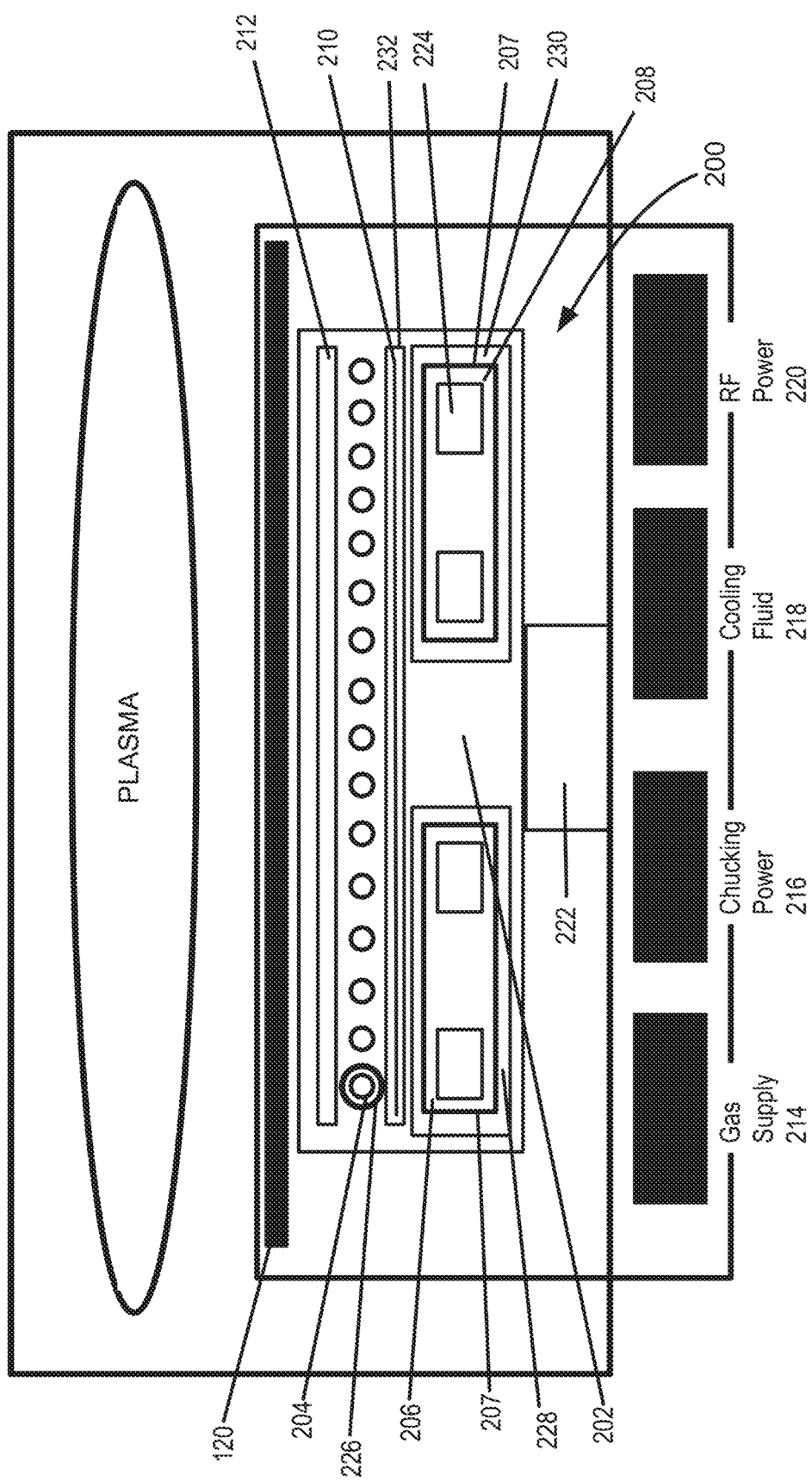
FIG. 2 illustrates a portion of a system and an electrostatic chuck in greater detail and in accordance with at least one embodiment of the disclosure.

FIG. 2 illustrates an electrostatic chuck 200, suitable for use as electrostatic chuck 116. Electrostatic chuck 200 includes a ceramic body 202, one or more heating elements 204 embedded within ceramic body 202, one or more electrodes 206, 208, a dielectric layer 210, and a fluid cavity 212. As illustrated, one or more gas supplies 214, power supplies 216, 220, and fluids 218 can be supplied to electrostatic chuck 200 through a ceramic shaft 222. As discussed in more detail below, electrostatic chuck 200 also includes one or more interface layers 226-232 that can mitigate mechanical fatigue and/or defects within electrostatic chuck 200 that might otherwise arise—e.g., from use of electrostatic chuck 200 during processing.

Ceramic body 202 can be formed of ceramic material. By way of examples, ceramic body 202 can include one or more of aluminum nitride, boron nitride, silicon carbide, and silicon nitrate. Ceramic body 202 can additionally include an additive selected from, for example, the group consisting of one or more of $Al_2MgO_4$, $Al_2O_3$, $Y_2O_3$, MgO, $CaF_2$, and LiF.

Heating element(s) 204 can be formed of a resistive heating material. By way of examples, one or more heating elements can be formed of one or more of molybdenum, tungsten, a molybdenum alloy, and a tungsten alloy, such as one or more of Mo, W, $Mo_xW_y$, $MoSi_x$, and/or $WSi_x$, where x and y are greater than 0 and less than 1 or between about 0.1 and about 0.5. In some cases, an alloy can include Mo and/or W and up to 50 at % of another element, such as silicon, or the other of Mo and W. Heating element 204 can be in the form of a wire or the like.

Electrodes 206, 208 can be formed of a suitable conducting material. For example, electrodes 206, 208 can be formed of a metal, such as molybdenum, or an alloy, such as the molybdenum alloys described above. The metal or alloy can be coated with a layer 207. Layer 207 can be formed of, for example, gold or platinum. As illustrated, a cooling fluid 224 can be provided within one or more electrodes 206, 208 to facilitate temperature regulation of electrodes 206, 208 and of electrostatic chuck 200.

Dielectric layer 210 can be formed of a suitable dielectric material, such as a ceramic material. The ceramic material used to form dielectric layer 210 can include a dielectric material that has a higher dielectric resistivity, compared to a dielectric resistivity of ceramic body 202 material. By way of examples, dielectric layer 210 can be or include AlN, $Si_3N_4$, SiC, BN, optionally with one or more additive selected from the group consisting of CaO, MnO, MgO, AlON, BaO, BeO, $ZrO_2$, CoO, ZnO, $Cr_2O_3$, and $Al_2O_3$; the dielectric layer can form during the sintering process.

Fluid cavity 212 can be formed during a mold and sintering process and can include a void or porous region formed within ceramic body 202. A gas, such as Ar, $N_2$, or CO, can be present within fluid cavity 212.

As noted above, electrostatic chuck 200 can include one or more interface layers 226-232. In accordance with examples of the disclosure, one or more of interface layers 226-232 form a solid solution with the ceramic body 202.

In the illustrated example, interface layer 226 can be formed overlying one or more (e.g., all) heating elements 204. Interface layer 226 can include a ceramic compound that comprises a metal selected from the group consisting of Mg, Ca, Mn, Al, Ba, Be, Zr, Co, Zn, Cr and one or more of oxygen, nitrogen, carbon, and phosphorous. By way of particular example, the interface layer can be or include MgO, alone or with an additive. Exemplary additives include one or more of CaO, MnO, MgO, AlON, BaO, BeO, $ZrO_2$, CoO, ZnO, $Cr_2O_3$, and $Al_2O_3$, and the like.

Advantageously, interface layers including (e.g., consisting of or consisting essentially of) MgO may exhibit about reduction of about 30% in volumetric expansion in relation interface layers formed from other ceramic materials, such as AlN. As will be appreciated by those of skill in the art in view of the present disclosure, reducing volumetric expansion of the interface layer reduces the likelihood of crack development at a given temperature. As will also be appreciated by those of skill in the art in view of the present disclosure, reducing volumetric expansion of the interface layer also increases temperature of processes in which the heaters having the interface layer may be employed.

Interface layers 228, 230 can be formed about electrodes 206, 208. Interface layers 228, 230 can be formed of any of the materials described above in connection with interface layer 226. Similarly, interface layer 232 can be formed about dielectric layer 210. Interface layer 232 can be formed of any of the materials described above in connection with interface layer 226. A thickness of any of interface layers 226-232 can range from about 1-10 nm to about 1-50 µm or about 1 mm to about 5 mm.

Figure 3:
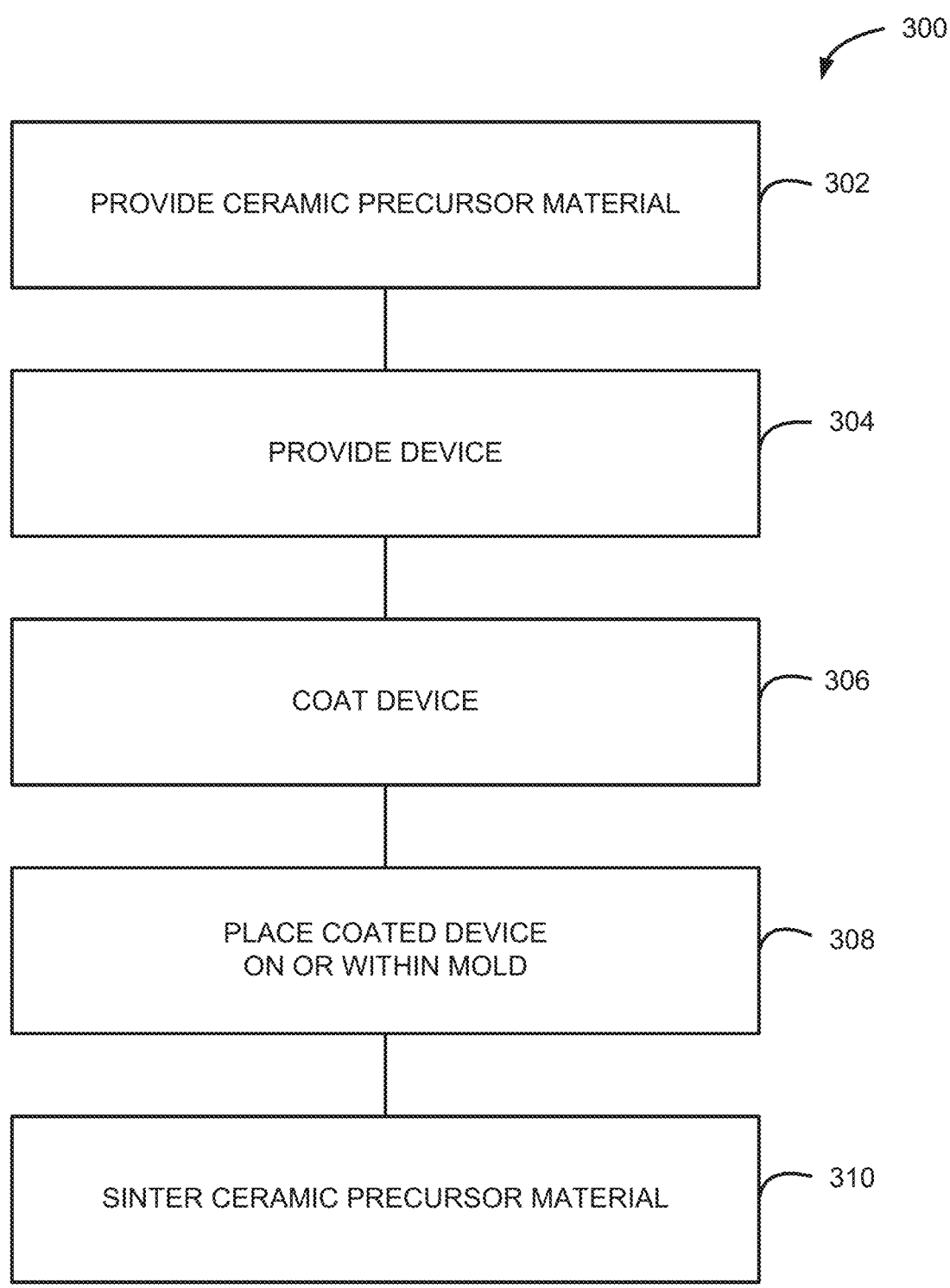
FIG. 3 illustrates a method in accordance with at least one embodiment of the disclosure.

Turning now to FIG. 3, a method 300 of forming an electrostatic chuck in accordance with embodiments of the disclosure is illustrated. Method 300 includes the steps of providing ceramic precursor (302), providing a device (304), coating the device with an interface material to form a coated device (306), placing the coated device on or within the ceramic precursor material (308); and sintering the ceramic precursor material to form the electrostatic chuck (310). The interface material can form an interface layer, such as an interface layer 226, 228, 230, and/or 232, between the device and ceramic material formed during the step of sintering.

Step 302 can include providing one or more precursors, such as one or more of aluminum nitride, boron nitride, silicon carbide, and silicon nitrate powder. In some cases, step 302 can additionally include providing one or more additives, such as one or more of $Al_2MgO_4$, $Al_2O_3$, $Y_2O_3$, MgO, $CaF_2$, and LiF to the mold.

Step 304 can include providing a device. Exemplary devices include heating elements, such as heating elements 204, electrodes, such as electrodes 206, 208, and a dielectric layer, such as dielectric layer 210.

One or more of the devices provided during step 304 can be coated with an interface material to form a coated device during step 306. The one or more of the devices can be coated with any of the interface layers noted above in connection with interface layers 226-232.

Coating during step 306 can be performed using a variety of techniques. For example, step 306 can include physical vapor deposition of material; electrochemical deposition of material; applying material on a surface of the device during an extrusion process; use of a gas-phase deposition process, such as chemical vapor deposition or a cyclical deposition process, such as atomic layer deposition. The material that is deposited can include the interface material or a metal that is subjected to an oxidation, nitridation, and/or phosphating atmosphere in a furnace. An interface layer that forms from the interface material can include a metal selected from the group consisting of Mg, Ca, Mn, Al, Ba, Be, Zr, Co, Zn, Cr and one or more of oxygen, nitrogen, fluoride and phosphate.

Once the device is coated, the coated device can be placed within a mold that includes the ceramic precursor material during step 308. By way of examples, coated electrode(s), coated heating element(s), and/or coated dielectric layer(s) can be placed in the mold during step 308.

During step 310, a ceramic body is formed by sintering. The sintering can occur at a temperature of about 1300° C.

to about 1900° C., a pressure of about 1 PSI to about 500 PSI, and a time of about 15 min to about several days. The interface layer(s) can form during step 310. The interface layer(s) can be a ceramic. In some cases, a spark sintering process can be used during step 310.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements (e.g., steps) described, may become apparent to those skilled in the art from the description. Such modifications and embodiments are also intended to fall within the scope of the appended claims.

What is claimed is:

1. A chuck comprising:
   a ceramic body;
   a device embedded within the ceramic body; and
   an interface layer formed overlying the device, wherein the interface layer forms a solid solution with the ceramic body.

2. The chuck of claim 1, wherein the ceramic body comprises one or more of aluminum nitride, boron nitride, silicon carbide, and silicon nitrate.

3. The chuck of claim 1, wherein the ceramic body comprises an additive selected from the group consisting of one or more of $Al_2MgO_4$, $Al_2O_3$, $Y_2O_3$, MgO, $CaF_2$, and LiF.

4. The chuck of claim 1, wherein the device comprises a heating element comprising one or more of molybdenum, tungsten $Mo_xW_y$, $MoSi_X$, and $WSi_X$.

5. The chuck of claim 1, wherein the device comprises a heating element comprising a wire.

6. The chuck of claim 5, wherein the heating element comprises a molybdenum alloy or a tungsten alloy.

7. The chuck of claim 6, wherein the molybdenum alloy comprises molybdenum and about 1 at % to about 50 at % of an element selected from the group consisting of W and Si.

8. The chuck of claim 1, wherein the interface layer reduces volumetric expansion with temperature (e.g., in the range of about 1 to about 800° C.) of the ceramic body, compared to an electrostatic chuck that does not include the interface layer.

9. The chuck of claim 1, wherein the interface layer comprises a ceramic compound that comprises a metal selected from the group consisting of Mg, Ca, Mn, Al, Ba, Be, Zr, Co, Zn, Cr and one or more of oxygen, nitrogen, carbon, and phosphorous.

10. The chuck of claim 9, wherein the interface layer further comprises an additive selected from the group consisting of CaO, MnO, MgO, AlON, BaO, BeO, $ZrO_2$, CoO, ZnO, $Cr_2O_3$, and $Al_2O_3$.

11. A method of forming a chuck, the method comprising the steps of:
    providing ceramic precursor material within a mold;
    providing a device;
    coating the device with an interface material to form a coated device;
    placing the coated device on or within a ceramic precursor material; and
    sintering the ceramic precursor material to form the electrostatic chuck,
    wherein the interface material forms an interface layer between the device and ceramic material formed during the step of sintering.

12. The method of claim 11, wherein the step of providing ceramic precursor material comprises providing one or more of aluminum nitride, boron nitride, silicon carbide, and silicon nitrate powder.

13. The method of claim 11, further comprising a step of providing an additive selected from the group consisting of $Al_2MgO_4$, $Al_2O_3$, $Y_2O_3$, MgO, $CaF_2$, LiF to the mold.

14. The method of claim 11, wherein the step of sintering comprises spark plasma sintering.

15. The method of claim 11, wherein the step of coating comprises physical vapor deposition (PVD) and/or chemical vapor deposition (CVD).

16. The method of claim 11, wherein the step of coating comprises electrochemical deposition.

17. The method of claim 11, wherein the step of coating comprises applying the interface material or an interface metal on a surface of the device during an extrusion process.

18. The method of claim 11, wherein the step of coating comprises deposition of a metal and subsequent oxidation, nitridation, and/or phosphating in a furnace.

19. The method of claim 11, wherein the step of coating comprises a gas-phase deposition process.

20. The method of claim 11, wherein the device comprises one or more of molybdenum and tungsten and wherein the interface material comprises a metal selected from the group consisting of Mg, Ca, Mn, Al, Ba, Be, Zr, Co, Zn, Cr and one or more of oxygen, nitrogen, fluoride and phosphate.

* * * * *